United States Patent [19]

Saeki

[11] 4,035,831

[45] July 12, 1977

[54] RADIAL EMITTER PRESSURE CONTACT TYPE SEMICONDUCTOR DEVICES

[75] Inventor: Shuzo Saeki, Yokohama, Japan

[73] Assignee: Agency of Industrial Science & Technology, Tokyo, Japan

[21] Appl. No.: 645,960

[22] Filed: Jan. 2, 1976

[30] Foreign Application Priority Data

Apr. 17, 1975 Japan .............................. 50-45807
Apr. 17, 1975 Japan .............................. 50-45812

[51] Int. Cl.² ................. H01L 23/42; H01L 23/44; H01L 23/46; H01L 27/02
[52] U.S. Cl. .................................. 357/79; 357/46; 357/56; 357/68
[58] Field of Search ................... 357/46, 56, 79, 68

[56] References Cited

U.S. PATENT DOCUMENTS

| 3,457,471 | 7/1969 | Moroney et al. | 357/79 |
| 3,525,910 | 8/1970 | Philips | 357/79 |
| 3,729,659 | 4/1973 | Bennett et al. | 357/79 |
| 3,755,722 | 8/1973 | Harland et al. | 357/46 |
| 3,877,059 | 4/1975 | Dockendorf | 357/46 |

FOREIGN PATENT DOCUMENTS 245,957   7/1963   Australia .............................. 357/46

*Primary Examiner*—Andrew J. James
*Attorney, Agent, or Firm*—Charles E. Pfund

[57] ABSTRACT

The pressure contact type semiconductor device comprises a transistor including a semiconductor substrate, an emitter region having portions protruding from the surface of the substrate and extending in the radial direction from a circle spaced a definite distance from the center of the substrate, a base region surrounding the protruding portions of the emitter region, emitter electrodes provided on respective protruding portions of the emitter region, a collector electrode mounted on the other surface of the substrate, and an electroconductive plate commonly urged against the emitter electrodes.

9 Claims, 9 Drawing Figures

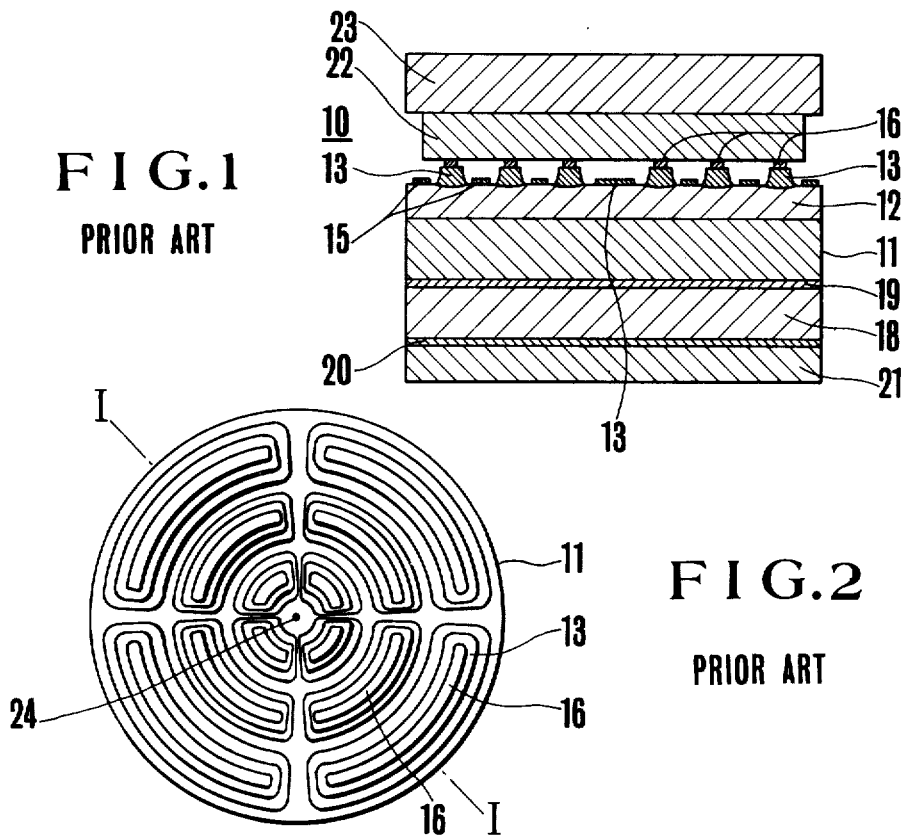
FIG.1 PRIOR ART
FIG.2 PRIOR ART
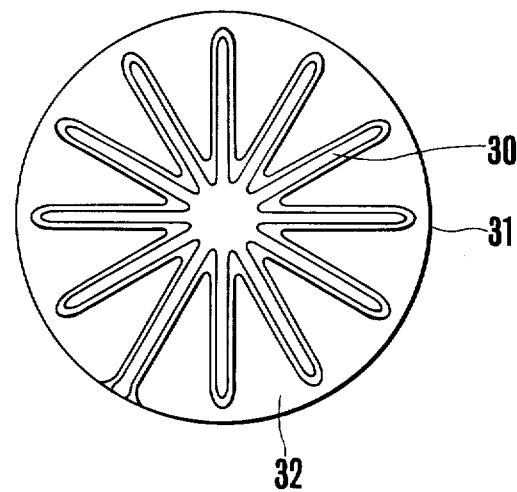
FIG.3 PRIOR ART

RADIAL EMITTER PRESSURE CONTACT TYPE SEMICONDUCTOR DEVICES

BACKGROUND OF THE INVENTION

This invention relates to a pressure contact type semiconductor device, and more particularly to a pressure contact type transistor wherein an electroconductive plate member is urged against an emitter electrode formed in a semiconductor substrate for collecting current.

One example of the prior art semiconductor device of the type referred to above will firstly be described with reference to FIGS. 1 and 2. The semiconductor device shown in FIGS. 1 and 2 comprises a N conductivity type semiconductor substrate 11 having a large diameter and made of silicon wafer, for example, A N$^+$impurity is diffused into one surface of the substrate by any one of known methods to form a collector region. A P conductivity type impurity is diffused into the entire surface of the opposite side of the semiconductor substrate 11 to form a layer 12 which is used as the base region. A N$^+$diffusion region is formed in the P conductivity type diffusion layer 12 and the N$^+$diffusion layer is then selectively etched to form protruding N$^+$diffusion regions 13 which are used as emitter regions. Base electrodes 15 are provided for the base region and emitter electrodes 16 are provided for the protruding portion of the emitter regions 13 by the method well known in the art. For the purpose of reinforcing the brittle semiconductor substrate 11, a reinforcing plate 18 made of strong material having substantially the same coefficient of thermal expansion as that of the semiconductor substrate 11 is secured to one surface thereof constituting the collector region by a solder layer 19. Although the reinforcing plate 18 may be used as a current path and a cooling member, from the standpoint of economy a copper block 21 is secured to the reinforcing plate 18 through a solder layer 20. A plate member 22 made of tungsten, for example, is urged against the emitter electrodes 16 and a copper block 23 is secured to the plate member 22. The semiconductor device described above is put in a doughnut shaped casing made of ceramic to form a pressure contact type transistor. The base electrodes 15 are lead out of the casing through the wall thereof.

The prior art semiconductor device described above has a number of problems as described in the following. For example, the emitter electrodes 16 and the base electrodes 15 have a plane pattern as shown in FIG. 2. More particularly, the emitter electrodes 16 and the base electrodes 15 are arranged alternately and concentrically. Each emitter electrode 16 is divided into four segments in the circumferential direction and respective base electrodes are interconnected through the gaps in respective emitter electrodes. With this electrode construction, due to heat cycle stresses created in the radial direction from the center of the semiconductor substrate 11 will act between the emitter electrodes 16 and the plate member 22. Moreover the stresses are larger in the peripheral portion of the semiconductor substrate than in the central portion thereof. Such heat cycle is created because the temperature of the semiconductor device is about 150° during the operation thereof but −20° C when the device is inoperative. When silicon is used for the semiconductor substrate 11, and tungsten is used for the plate member 22, since the coefficients of thermal expansion of silicon and tungsten are $3 \times 10^{-6}/°C$ respectively, when the heat cycle is repeated a substantial relative displacement will occur between the emitter electrodes 16 and the plate member 22. Especially when the base and emitter electrodes are arranged concentrically the stresses are applied in a direction perpendicular to respective electrodes and since the radial spacing between adjacent electrodes is extremely small, the emitter electrodes will be deformed or crushed frequently. The chance of such damage increases from the center toward the periphery of the substrate.

To solve this problem it has been proposed to arrange the electrodes in the radial direction or the direction of stresses caused by the heat cycle as shown in FIG. 3. In this arrangement, the base electrodes 30 are arranged in the radial direction which the emitter region 32 extends into the spaces between the base electrodes 30 from the peripheral portion of the semiconductor substrate 31.

With this construction, however, the contact area between the emitter and base regions is smaller than that of the construction shown in FIG. 1. Moreover, it is not possible to effectively utilize the emitter region although the area of the emitter region has been increased. The contact area between the emitter and base regions may be increased by increasing the number of the base electrodes extending in the radial direction. With such construction it is impossible to extend the emitter region formed between the base regions to points near the center of the semiconductor substrate 31. Accordingly, it is impossible to use the central portion of the semiconductor substrate as the semiconductor device. Even when the emitter region is formed close to the center, the spacing between the elctrodes becomes extremely small thus causing short circuiting Such difficulty increases as the number of base electrodes extending in the radial direction increases.

SUMMARY OF THE INVENTION

Accordingly it is an object of this invention to provide an improved semiconductor device comprising a pressure contact type transistor which is less susceptible to the stress caused by heat cycle and having large contact area between the emitter and base regions so that it is possible to effectively utilize the surface of the semiconductor substrate.

Another object of this invention is to provide a semiconductor device comprising a high gain and high power pressure contact type transistor.

A further object of this invention is to provide an improved semiconductor device comprising a plurality of transistors connected in a Darlington fashion wherein the interelectrode connections between the mesa shaped portions of the emitter region of a transistor of a preceding stage and the base region of a transistor of a succeeding stage will not be fused by large current.

According to one embodiment of this invention there is provided a pressure contact type semiconductor device comprising a semiconductor substrate, an emitter region having portions protruding from one surface of the semiconductor substrate and extending substantially in the radial direction from a circle spaced a definite distance from one point of the surface, a base region formed on the semiconductor substrate to surround the protruding portions of the emitter region, emitter electrodes provided on respective protruding portions of the emitter region, a base electrode provided on the base region, a collector electrode mounted on the other surface of the semiconductor substrate, and an electroconductive plate member commonly urged against the emitter electrodes, the emitter, collector and base regions constituting a pressure contact type transistor.

According to a modified embodiment of this invention there is provided a pressure contact type transistor and a second transistor connected with the pressure contact type transistor in a Darlington fashion, the pressure contact type transistor comprising a semiconductor substrate, a first emitter region having portions protruding from one surface of the semiconductor substrate and extending substantially in radial direction from a circle spaced a defnite distance from one point on the surface, a first base region formed on the semiconductor substrate to surround the protruding portions of the first emitter region, first emitter electrodes provided on respective protruding portions of the first emitter region, a first base electrode provided on the first base region, a collector electrode mounted on the other surface of the semiconductor substrate, and an electroconductive plate member commonly urged against the first emitter electrodes, and the second transistor comprising a second emitter region including an annular segment formed in the area of the semiconductor substrate surrounded by the first emitter region and protruding from the surface of the semiconductor substrate, a second base region surrounding the second emitter region and including portions extending in the radial direction from the center of the semiconductor substrate, a second base electrode mounted on the second base region, and a collector electrode common to the first mentioned collector electrode.

BRIEF DESCRIPTION OF THE DRAWINGS

Further objects and advantages of the invention will be more fully understood from the following detailed description taken in conjunction with the accompanying drawings in which:

FIG. 1 is a sectional view taken along a line I — I in FIG. 2, showing the fundamental construction of a prior art pressure contact type semiconductor device;

FIG. 2 is a plan view taken along a line II — II in FIG. 1 showing concentric arrangement of the emitter and base regions;

FIG. 3 is a plan view of another prior art pressure contact type semiconductor device showing radial arrangement of emitter and base regions;

DESCRIPTION OF THE PREFERRED EMBODIMENTS

Figure 4:
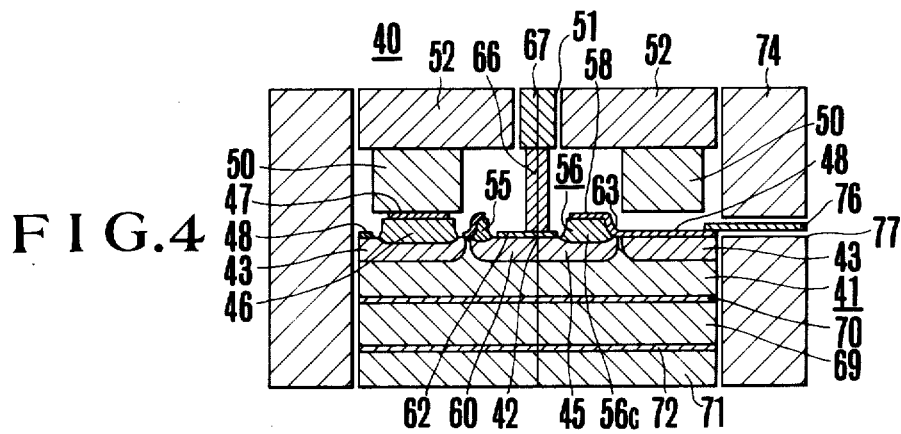
FIG. 4 is a longitudinal sectional view of one embodiment of the novel pressure contact type semiconductor device embodying the invention.
Figure 5:
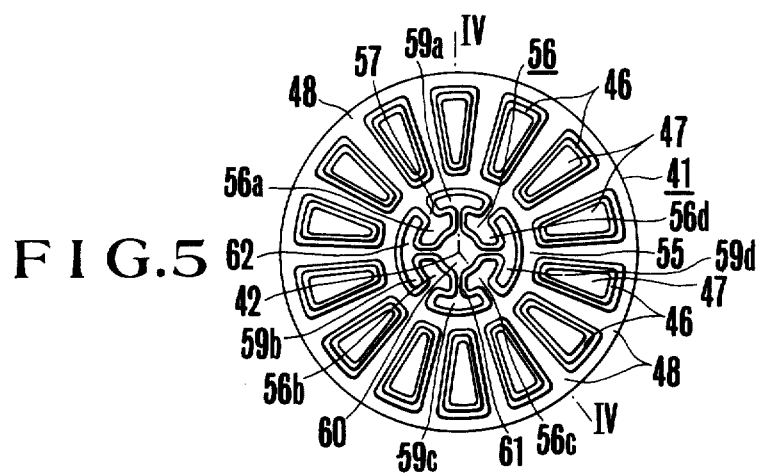
FIG. 5 is a plan view showing an arrangement of the emitter and base regions on a semiconductor substrate with a plate member urging against the emitter electrodes removed.

FIGS. 4 and 5 illustrate one embodiment of the pressure contact type semiconductor device comprising a pair of transistors connected in a Darlington fashion. The semiconductor device shown in FIGS. 4 and 5 comprises a circular N conductivity type semiconductor substrate 41 having a large diameter made of a silicon wafer, for example. A $N^+$ type impurity is diffused into one surface of the semiconductor substrate 41 by a well known method to form a collector layer. A doughnut shaped first base region 43 extending in the radial direction from a circle a predetermine distance spaced from the center of the semiconductor substrate 41 and a circular second base region 45 formed on the exposed surface surrounded by the first base region 43 are formed on the opposite surface of the semiconductor substrate 41 by diffusing a P conductivity type impurity. According to one feature of this invention, an emitter region having a plurality of protruding portions 46 (four in this example) are formed within the first base region 43. These emitter portions 46 are formed by diffusing a P conductivity type impurity into the surface of the semiconductor substrate 41, then diffusing a N conductivity type impurity into the surface diffused with the P conductivity type impurity and then selectively etching the layer diffused with the N conductivity impurity to form said radial pattern in a manner well known in the art. For this reason, the emitter region is of the mesa type so that their major portions 46 project above the base region 43 and are surround thereby. The reason for providing radial emitter region is to eliminate the effect of the stress caused by heat cycle and acting along the interface between the semiconductor substrate on which the emitter electrodes are provided and the plate member urged against the emitter electrodes as will be described later. Emitter electrodes 47 are formed on respective protruded portions 46 of the emitter region, and a base electrode 48 is provided for the first base region 43 to surround respective emitter electrodes. These electrodes may be formed by vapour deposition of aluminum, for example. A common annular disc 50 made of tungsten, for example, is urged against respective emitter electrodes 47. Preferably, the annular disc should be made of a material having a thermal expansion coefficient close as far as possible to that of the semiconductor substrate 41. A copper block 52 having a central opening 51 is secured to the annular disc 50 as by soldering.

Turning now to the second base region 45 formed within the annular first base region 43 and isolated therefrom, the region 45 comprises two concentric annular emitter regions 55 and 56. The emitter region 56 is divided into four segments 56a through 56d and each segment is connected to the emitter region 55 by a connecting member 57. Emitter electrodes 58 are formed on the emitter regions 55, 56 and 57 which are arranged as above described by vapour deposition of aluminum, for example. When the emitter regions are formed as above described, an annular base region 59 comprising four segments 59a through 59d is exposed between emitter regions 55 and 56, and these segments are connected by connecting members 61 to the circular base region 60 at the central portion 42 of the semiconductor substrate 41. A base electrode 62 is formed on the base regions 59, 60 and 61 by vapour deposition of aluminum, for example.

Figure 6:
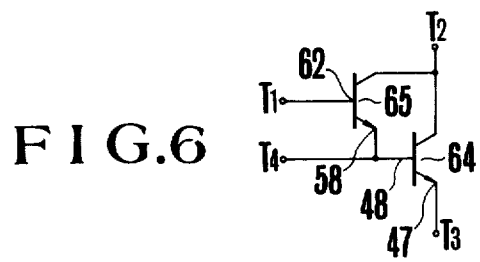
FIG. 6 is a diagram showing a Darlington circuit formed by the embodiment shown in FIGS. 4 and 5.

In this example, an electroconductive layer 63 is formed by vapour depositing aluminum for interconnecting the base region 48 of a pressure contact type transistor 64 constituted by the first base region 46, the emitter region 46 and the collector layer of the semiconductor substrate, and the emitter electrode 58 of a second transistor 65 constituted by the second base region 44, the emitter region 55 and the collector region of the semiconductor substrate 41 so as to form a high power semiconductor device by a pair of transistors connected in a Darlington fashion as shown in FIG. 6. A plate member 66 made of tungsten, for example, is urged against the base electrode 62, and a copper block 67 contained in the central opening 51 of the copper block 52 is secured to the plate member 66, as by soldering. Further, a reinforcing plate 69, made of tungsten, for example, is secured to the lower surface of the semiconductor substrate 41 by a layer of solder 70, and a copper block 71 serving as a current path and a heat dissipator is secured to the reinforcing plate 69 by a layer of solder 72.

The semiconductor assembly 40 is contained in an annular ceramic casing 74 and a lead wire 76 connected to the base electrode 48 of the pressure contact type transistor 64 is extended through an opening 77 in the side wall of the casing 77 thereby completing a semiconductor assembly.

Where the semiconductor device 40 is connected in a Darlington circuit, an input signal is applied to a terminal $T_1$ (corresponding to the copper block 67 shown in FIG. 4) connected to the base electrode 62 of transistor 65 shown in FIG. 6, and the output is derived out through a terminal $T_3$ (corresponding to the copper block 52 shown in FIG. 4) connected to the emitter electrode and a terminal $T_2$ (corresponding to the copper block 71 shown in FIG. 4) connected to the collector electrode. Where only one such pressure contact type transistor 64 is used, the input signal is applied to a terminal $T_4$ (corresponding to lead wire 76 extending through the annular casing 74) connected to the base electrode 48.

The semiconductor device of this invention has the following advantages.

1. Since the emitter electrodes 47 acting as the pressure contact electrode of the pressure contact type transistor 64 are arranged radially, there is no fear of damaging the electrodes by the heat cycle caused by the difference in the thermal expansion coefficients of the semiconductor substrate 41 and the annular disc or plate 50 urged against the emitter electrodes 47.

2. Although the emitter regions of the pressure contact type transistor 64 are arranged radially, since they are completely surrounded by the base region 43, it is possible to increase the contact area between regions 43 and 46 more the prior art construction and to make it more efficient.

3. Furthermore, since the pressure contact type transistor 64 utilizes on the peripheral portion of the semiconductor substrate 41, it is possible to form another transistor or such passive elements as a capacitor or resistors at the central portion of the semiconductor substrate as illustrated in the example. In this example, the pressure contact type transistor is shown to extend between a point about one half of the radius and the peripheral edge, but it may be disposed between a point about ⅓ of the radius and the peripheral edge. If the pressure contact type transistor were extended to a point closer to the center, effective utilization of the surface of the semiconductor substrate would become difficult just like the conventional transistor described above.

4. Since the pressure contact type transistor utilizes only the peripheral portion of the semiconductor substrate by forming another transistor at the central portion of the semiconductor substrate as shown in the example and by using the central transistor in a preceding stage and the pressure contact type transistor in the succeeding stage, a high gain, high power semiconductor device can be obtained. Especially when the emitter region of the central transistor is made annular the pattern thereof becomes relatively simple thus providing a semiconductor device of higher gain and higher power.

Although in the foregoing embodiment, the emitter electrodes of the contact type transistor were disposed in the radial direction, so long as the relative displacement between the emitter electrodes and the plate member urged thereagainst caused by contraction and expansion is within 30°, no problem occurs. If the relative displacement exceeds 30°, even if the emitter electrodes are disposed in a radial pattern, the damages due to the stess created by the contraction and elongation of the plate member and the emitter electrodes occur frequently thus decreasing the yield to 80%. On the other hand, if the relative displacement is limited to be less than 30°, if the yield could be improved to 95%.

Although in the embodiment described above, a N conductivity type silicon wafer having a large diameter was used as the semiconductor subtrate, it is also possible to use a P conductivity type silicon wafer. Further, the periphery of the silicon wafer is not always required to be a perfect circle. If the silicon wafer is not circular, the pattern of the emitter region of the pressure contact type transistor may be modified to suit the configuration of the wafer. That is, the pattern may not be a point symmetry pattern.

Figure 7:
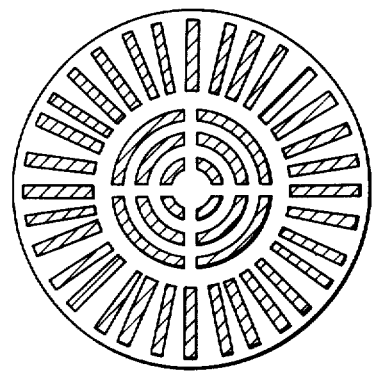
FIGS. 7 and 8 show two examples of the emitter region pattern utilized in the pressure contact type semiconductor device of this invention and FIG. 9 is a partial sectional view showing means for reinforcing a conductor layer used to interconnect the emitter electrode on an emitter region protruding from the semiconductor substrate of a transistor of the preceding stage and the base electrode on a base region of a transistor of the succeeding stage, said transistors being connected in a Darlington fashion.
Figure 8:
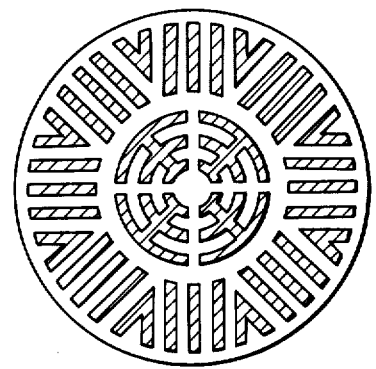

FIGS. 7 and 8 show examples of the pattern of the emitter regions utilized in the pressure contact type semiconductor device wherein hatched portions show the emitter regions and the remaining portions the base region. It should be understood that the center of the radial pattern of the emitter regions may be displaced from the center of the wafer and that "radial" may include emitter regions which are only aprroximately radial as shown in FIG. 8, for example.

Figure 9:
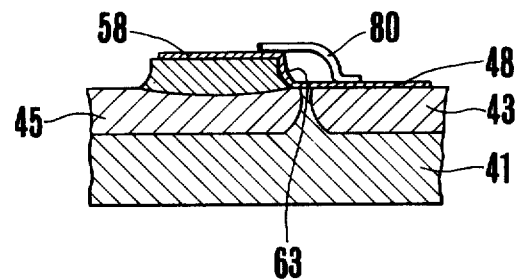

In the above described embodiment, the base electrode 48 of the pressure contact type transistor 64 formed in the peripheral portion of the semiconductor substrate and the emitter electrode 58 of the transistor 65 formed in the central portion of the semiconductor substrate were interconnected by vapour depositing aluminum. However, since the emitter electrode 58 is formed on the emitter region projecting above the semiconductor substrate, the thickness of some portions of the conductive layer formed to effect such interconnection, especially, the portions of the conductive layer formed on the shoulder and the inclined portion of the emitter region becomes smaller than that required. For this reason, when current of several tens amperes flows through the conductive layer, the layer would be broken due to the resistance loss of the conductive layer. To prevent this, the thin portions of the conductive layer may be bridged by a metal piece 80 having larger current carrying capacity than the rated current capacity of the conductive layer as shown in FIG. 9. The metal piece 80 may be secured to the conductive layer or both electrodes by well known ultrasonic welding. This construction provides a more reliable semiconductor device having longer life.

Although the invention has been shown and described in terms of specific embodiments it will be clear that the invention is by no means limited to such specific embodiment and that various changes and modification will readily occur to one skilled in the art. For example, in the illustrated embodiment, at first the base region was formed, the emitter impurity was diffused into entire base region, and then diffused region was selectively etched to form the emitter region protruded from the base region. However, it is also possible to selectively etch the base region so as to form mesa type emitter region.

What is claimed is:

1. A pressure contact type contact type semiconductor device comprising a semiconductor substrate, an emitter region having a plurality of portions protruding from one surface of said semiconductor substrate and extending substantially in the radial direction from a position spaced a definite distance from one point on said surface, a base region formed on said semiconductor substrate to surround said protruding portions of said emitter region, emitter electrodes provided on respective protruding portions of said emitter region, a base electrode provided on said base region, a collector electrode mounted on the other surface of said semiconductor substrate, and an electroconductive plate member commonly urged against said emitter electrode, said emitter, collector and base regions constituting a pressure type transistor.

2. The presence contact type semiconductor device according to claim 1 wherein said semiconductor substrate is circular, said one point lies at the center of said semiconductor substrate and said definite distance is larger than ⅓ of the radius of said semiconductor substrate.

3. The pressure contact type semiconductor device according to claim 1 wherein said emitter electrodes are arranged in the radial direction in a range of less than 30° with respect to the direction of expansion and contraction of said plate member.

4. The pressure contact type semiconductor device, according to claim 1 which further comprises an additonal semiconductor element formed on the portion of said surface of the semiconductor substate not occupied by said emitter region.

5. The pressure contact type semiconductor device according to claim 4 wherein said semiconductor element comprises a transistor which is connected with said pressure contact type transistor in Darlington fashion.

6. The pressure contact type semiconductor device according to claim 5 wherein said additional transistor comprises a second base region independent of and surrounded by the base region of said pressure contact type transistor, an annular second emitter region formed in said second base region and protruding from said semiconductor substrate, a second base electrode formed on said second region, a second emitter electrode formed on said emitter region, a collector formed on the other surface of said semiconductor substrate.

7. The pressure contact type semiconductor device according to claim 6 wherein the base electrode of the pressure contact type transistor and the emitter electrode of said additional transistor are interconnected by an electroconductive layer.

8. The pressure contact type semiconductor device according to claim 7 which further comprises a metal piece having larger current carrying capacity than said electroconductive layer, said metal piece being connected in parallel with said electroconductive layer.

9. A semiconductor device comprising a pressure contact type transistor and a second transistor connected with said pressure contact type transistor in Darlington fashion, said pressure contact type transistor comprising a semiconductor substrate, a first emitter region having a plurality of portions protruding from one surface of said semiconductor substrate and extending substantially in the radial direction from a position spaced a definite distance from one point on said surface, a first base region formed on said semiconductor substrate to surround said protruding portions of said first emiter region, first emitter electrodes provided on respective protruding portions of said first emitter region, a first base electrode provided on said first base region, a collector electrode mounted the other surface of said semiconductor substrate, and an electroconductive plate member commonly urged against said first emitter electrodes, and said second transistor comprising a second emitter region including an annular segment formed in the area of said semiconductor substrate surrounded by said first emitter region and protruding from said surface of said semiconductor substrate, a second base region surrounding said second emitter region and including portions extending in the radial direction from the center of said semiconductors substrate, a second base electrode mounted on said second base region, and a collector electrode common to said first mentioned collector electrode.

* * * * *